United States Patent

Besserer et al.

[11] Patent Number: 5,899,545
[45] Date of Patent: May 4, 1999

[54] FRAME FOR A SWITCHGEAR CABINET

[75] Inventors: Horst Besserer, Herborn; Marc Hartel, Reiskirchen; Jürgen Zachrai, Dillenburg, all of Germany

[73] Assignee: Rittal-Werk Rudolf Loh GmbH & Co. KG, Herborn, Germany

[21] Appl. No.: 08/737,668

[22] PCT Filed: Oct. 7, 1996

[86] PCT No.: PCT/EP95/03958

§ 371 Date: Nov. 20, 1996

§ 102(e) Date: Nov. 20, 1996

[87] PCT Pub. No.: WO96/14728

PCT Pub. Date: May 17, 1996

[30] Foreign Application Priority Data

Nov. 5, 1994 [DE] Germany ............................. 44 39 544

[51] Int. Cl.⁶ .................................................. A47B 43/00
[52] U.S. Cl. .................................. 312/257.1; 312/265.4; 211/26; 49/397
[58] Field of Search .............................. 312/257.1, 265.1, 312/265.2, 265.3, 265.4, 265.5, 265.6, 263, 140, 329; 211/26, 182, 189, 191; 49/381, 385, 397; 361/724, 725; 52/653.1, 653.2

[56] References Cited

U.S. PATENT DOCUMENTS

| 449,936 | 4/1891 | Jackson ........................................ 49/397 |
| 606,724 | 7/1898 | Lucas ........................................ 49/381 |
| 2,443,515 | 6/1948 | Rockwell .......................... 312/257.1 X |
| 3,655,254 | 4/1972 | Mayer et al. ......................... 312/265.4 |
| 4,412,708 | 11/1983 | Palka ..................................... 312/138.1 |
| 4,988,008 | 1/1991 | Blum et al. ........................... 211/26 X |
| 5,165,770 | 11/1992 | Hahn ..................................... 211/26 X |
| 5,228,762 | 7/1993 | Mascrier .......................... 312/265.1 X |
| 5,275,296 | 1/1994 | Zachrai ............................. 312/265.4 X |
| 5,380,083 | 1/1995 | Jones et al. ....................... 312/265.6 X |

FOREIGN PATENT DOCUMENTS

| 630221 | 4/1963 | Belgium ............................. 312/265.5 |
| 2685137 | 6/1993 | France . |
| 3917985 | 12/1989 | Germany . |
| 4036664 | 5/1992 | Germany . |
| 9216156 | 4/1993 | Germany . |
| 9315131 | 1/1994 | Germany . |
| 9405618 | 9/1994 | Germany . |
| 598703 | 5/1978 | Switzerland . |

Primary Examiner—Peter M. Cuomo
Assistant Examiner—James O. Hansen
Attorney, Agent, or Firm—Pauley Petersen Kinne & Fejer

[57] ABSTRACT

The invention pertains to a frame for a switchgear cabinet. The frame has horizontal and vertical frame members and depth struts; open sides of the frame can be closed by wall elements and at least one door. Mounting a door is simplified in that the depth members have extensions which project beyond the horizontal and vertical frame members at the front and/or back end of the frame and which have with vertically directed holes for hinge pins or closing bolts.

15 Claims, 2 Drawing Sheets

FRAME FOR A SWITCHGEAR CABINET

BACKGROUND OF THE INVENTION

1. Field of the Invention

This invention relates to a rack for a switchgear cabinet having horizontal and vertical rack legs and depth struts, and open sides that can be closed by wall elements and at least one door.

2. Description of Prior Art

As a rule, in known racks two profiled sides of the rack legs which are located perpendicularly with respect to each other form outsides of the rack and an outer edge thereof. Special hinge elements must be installed on the vertical rack legs for hinging the door. Additionally, separate locking elements must be installed on the locking side of the door. In the process, the opening side of the door is often fixed on the rack and cannot be changed at the operating site of the switchgear cabinet. In addition, an open side of the rack which is to be closed by the door is also predetermined as a rule.

SUMMARY OF THE INVENTION

In connection with a rack of the general type mentioned above, it is one object of this invention to fix a door on the rack without additional hinge and locking elements, wherein the hinge and closing sides of the door can be easily reversed and the door intended for one side of the rack can also be attached to the opposite side of the rack.

This object is attained in accordance with this invention by having depth struts on the front and/or back of the rack with extensions projecting past the horizontal and vertical rack legs, that have vertically oriented receivers for hinge bolts or locking bolts of the door.

With this layout of the depth struts it is possible to attach a door to the front and/or back of the rack, wherein the door can be opened toward the left or the right. The hinge bolts of the locking side are received in the same way as the locking bolts by the receivers of the extensions, so that the opening side can be arbitrarily selected. With this embodiment the depth struts assume the functions of the hinge and locking elements which are additionally attached in the known racks.

In this embodiment, the extensions of the depth struts can be made of one piece with the depth struts. The extensions can also be embodied as separate corner elements which are connected with the adjoining horizontal and vertical rack legs and the associated depth struts.

If, as in another embodiment, the extension has a horizontally oriented receiver, then uniformly embodied depth struts or extensions can be used at all side edges or corners of the rack.

In one embodiment of the door for attachment to the rack, the door has on the inside in the area of the corners bearing blocks, which support a continuous, vertical guide, partially provided with an interior thread, for a hinge bolt or a locking bolt.

In this case uniformly embodied bearing blocks are attached to the door such that on the hinge side of the door the interior threads face away from the associated horizontal side of the door, while on the locking side of the door the interior threads face corresponding horizontal sides of the door.

A further simplification can be achieved on the locking side of the door if the locking bolts are embodied as sliding rods of a sliding rod locking device.

A definite guiding of the sliding rods in the bearing blocks is achieved by the diameter of the sliding rods being matched to the diameter of the guides in the bearing blocks.

So that the hinge bolts can be screwed into the bearing blocks without affecting this guide, the interior thread of the bearing blocks has an interior diameter which is greater than the diameter of the guide and the hinge bolts have appropriately matched guide sections and thread elements.

If only one side of the rack is to be closed by a door, it is possible for separate corner elements, without extensions, to end flush with adjoining horizontal and vertical rack legs and to be attached to the front or back of the rack. Depth struts may be provided with an extension at only one end. The rack then has projecting extensions for attaching a door on only one side.

BRIEF DESCRIPTION OF THE DRAWINGS

The invention will be explained in detail by means of an exemplary embodiment represented in the drawings, wherein.

DESCRIPTION OF PREFERRED EMBODIMENTS

Figure 1:
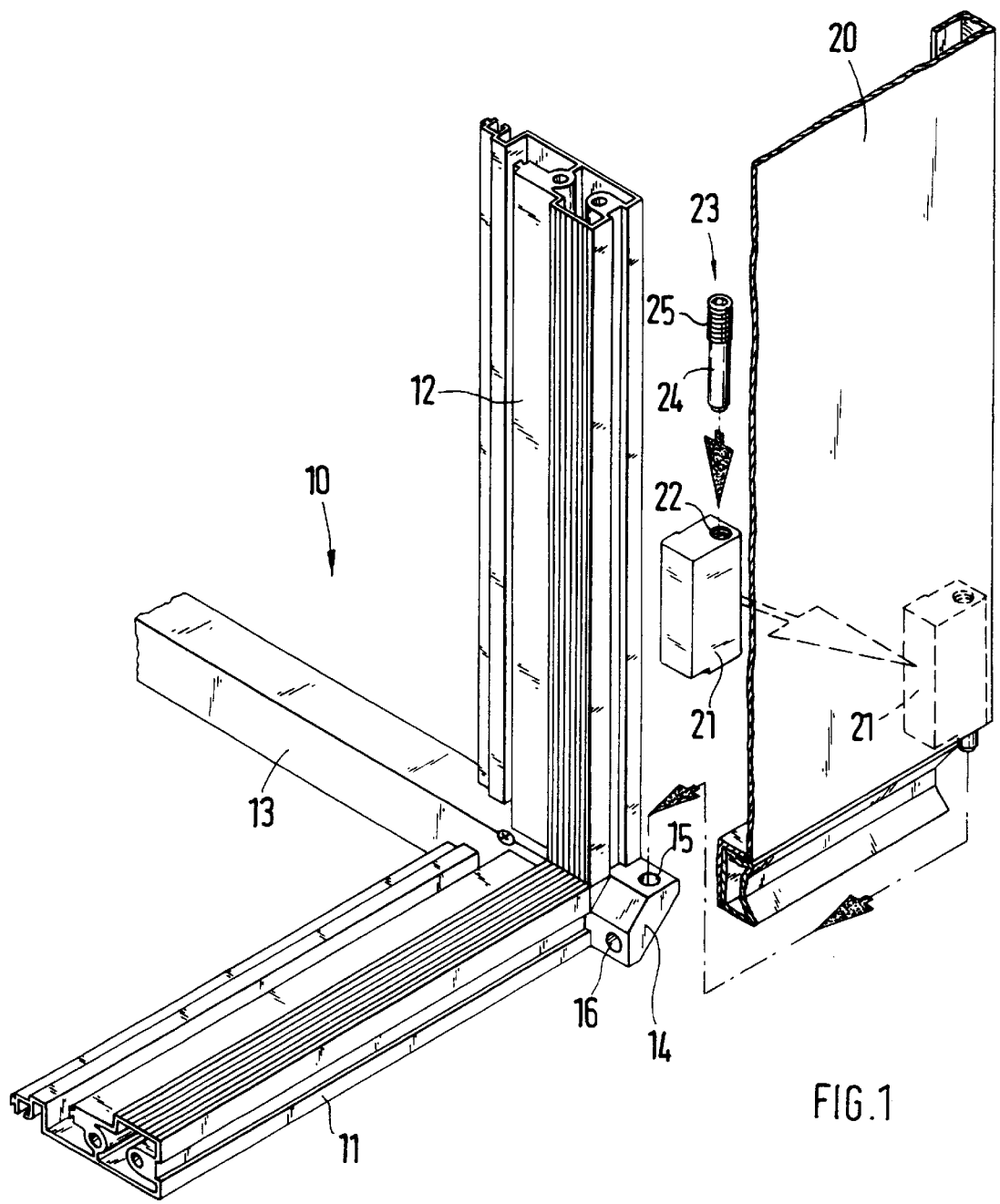
FIG. 1 is an exploded view of a lower, right part of a rack on which a door is hinged according to one preferred embodiment of this invention.

The horizontal rack leg 11, the vertical rack leg 12 and the depth strut 13 of the rack 10 of the switchgear cabinet, which comprise a right, lower corner on the front of the rack 10, are represented in FIG. 1. The depth strut 13 projects with an extension 14 past the horizontal rack leg 11 and the vertical rack leg 12 in the area of all corners of the rack 10, so that a door 20 can be attached to the front as well as the back of the rack 10.

The extensions 14 can be constructed of one piece with the depth struts 13. However, the extensions 14 can also be connected at separate corner elements with the adjoining horizontal and vertical rack legs 11 and 12 and the associated depth struts 13.

The extensions 14 have a vertically oriented receiver 15 for a hinge bolt 23. If the extensions 14 also have a horizontal receiver 16 positioned perpendicularly with respect to the receiver 15, it is possible to employ uniform depth struts 13 at all side edges of the rack 10, or uniform corner elements at all corners of the rack 10.

In all corner areas an inside of the door 20 has bearing blocks 21 with a continuous guide 26 at one end with an interior thread 22 with an enlarged diameter.

On the hinge side shown in FIG. 1, the bearing blocks 21 are attached to the door 20 in such a way that the interior thread 22 faces away from a facing horizontal side of the door 20. Hinge bolts 23 are screwed into the bearing blocks 21. A guide section 24 of the hinge bolt 23 is matched to the guide 26 and the receiver 15, and a thread element 25 is matched to the interior thread 22. The hinge bolt 23 is rotated into the bearing block 21 far enough so that it is introduced into the receiver 15. The door 20 is connected in the same way with the extension 14 and hinged at the upper edge of the rack 10. Since the rack 10 has extensions 14 projecting at all four corners, the door 20 can be hinged in this manner on the left or right of the front or back of the rack 10. The front and back of the rack 10 can also be closed with two doors.

Figure 2:
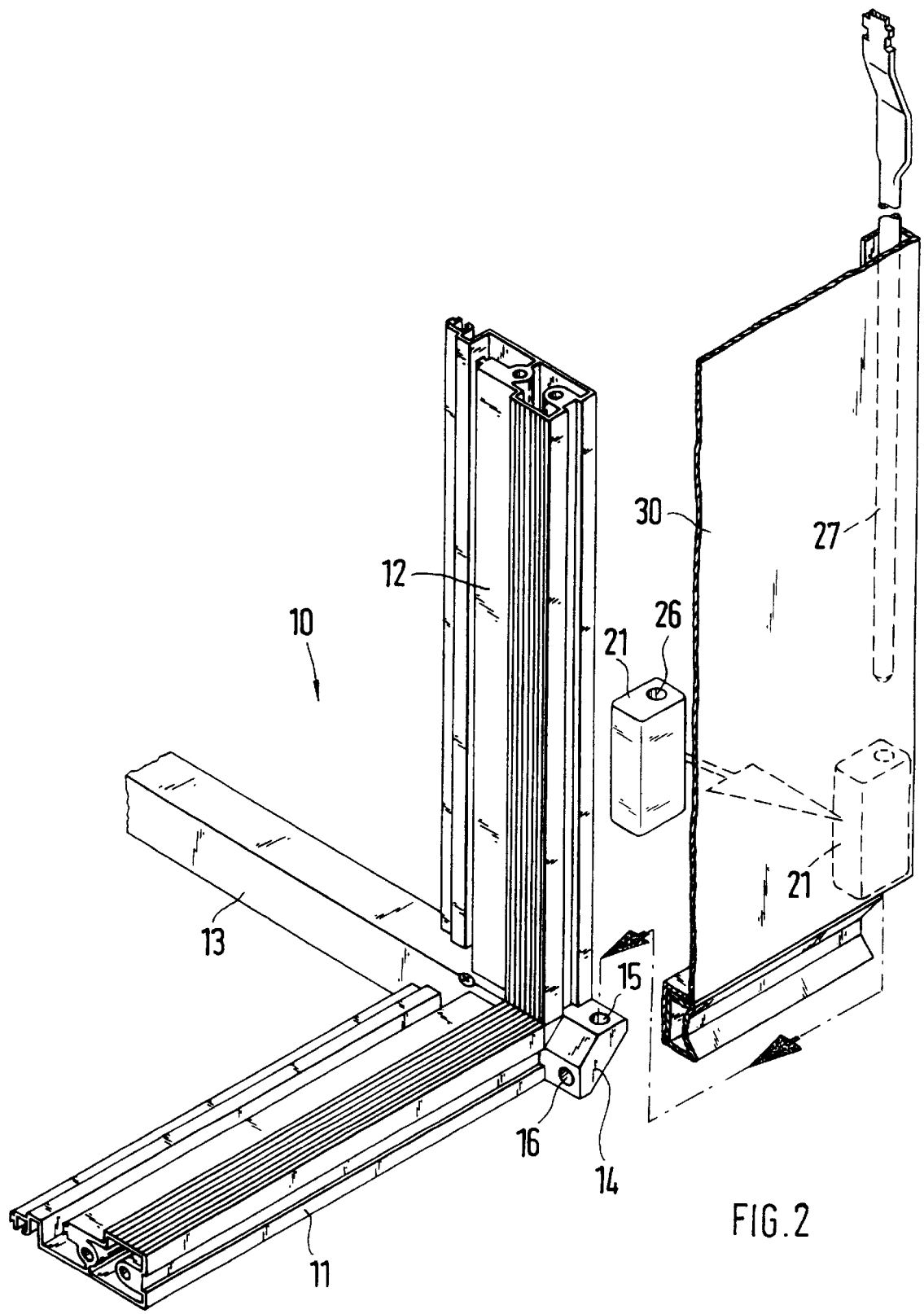
FIG. 2 is an exploded view of a similar lower part of a rack for receiving a locking bolt of the door.

Two bearing blocks 21 can also be attached on a locking side of the door 20, but in such a way that the interior threads 22 face the facing horizontal sides of the door 20, as shown in FIG. 2. A sliding rod lock, known per se, is attached to the door 20 as the locking device whose sliding rods are represented by the locking rods 27. The diameter of the locking rods 27 is matched to and adjustably guided within the guides 26 of the bearing blocks 21. In a locked state of the sliding rod lock, the locking rods 27 are inserted from out of the bearing blocks 21 into the receivers 15 of the extensions 14. The sliding rod lock has two oppositely adjustable locking rods 27, so that the door 20 is locked at the top and the bottom. Thus, the door 20 supports four bearing blocks 21, which are uniformly embodied, but are attached in positions which are rotated by 180° on the hinge and locking sides. If only one side of the rack 10 is to be closed with a door 20, separate corner elements end flush with adjoining horizontal and vertical rack legs without extensions, and are attached to the front or back of the rack and if depth struts are provided have an extension at only one end. Thus the rack can be constructed in such a way that extensions 14 for attaching a door 20 only project from the front or only the back of the rack 10.

We claim:

1. In a rack for a switchgear cabinet having horizontal and vertical rack legs and depth struts, and open sides closed off by wall elements and at least one door, the improvement comprising:

the depth struts (13) on a face of the rack having extensions (14) projecting past the horizontal and vertical rack legs (11, 12), the depth struts (13) having vertically oriented receivers (15) for one of hinge bolts (23) and locking bolts (27) adjustably attached to the door (20); and a plurality of bearing blocks (21) attached to corner areas of an inside surface of the door (20), the bearing blocks (21) having vertical guides (26) partially provided with an interior thread (22) engaging one of the hinge bolts (23) and the locking bolts (27).

2. In a rack in accordance with claim 1, wherein the extensions (14) are connected in one piece with the depth struts (13).

3. In a rack in accordance with claim 2, further comprising depth struts (13) that have an extension (14) at only one end.

4. In a rack in accordance with claim 1, wherein the extensions (14) are corner elements separate from the depth struts (13), the extensions (14) are connected with the adjoining horizontal and vertical rack legs (11, 12) and the corresponding depth strut (13).

5. In a rack in accordance with claim 4, wherein each of the extensions (14) has a horizontally oriented receiver (16).

6. In a rack in accordance with claim 5, wherein the interior threads (22) of the bearing blocks (21) have an interior diameter greater than a diameter of the guide (26), and the hinge bolts (23) have guide sections (24) and thread elements (25) that correspond to the interior threads (22).

7. In a rack in accordance with claim 5, wherein on a hinge side of the door (20) the bearing blocks (21) are attached such that the interior threads (22) face away from an associated horizontal side of the door (20), and on a locking side of the door (20) each of the bearing blocks (21) faces the associated horizontal side of the door (20).

8. In a rack in accordance with claim 7, wherein the locking bolts (27) are sliding rods of a sliding rod locking device.

9. In a rack in accordance with claim 8, wherein the interior threads (22) of the bearing blocks (21) have an interior diameter greater than a diameter of the guide (26), and the hinge bolts (23) have guide sections (24) and thread elements (25) that correspond to the interior threads (22).

10. In a rack in accordance with claim 8, wherein a diameter of each of the sliding rods is matched to a diameter of the guides (26) in the bearing blocks (21).

11. In a rack in accordance with claim 4, further comprising separate corner elements without extensions that end flush with the adjoining horizontal and vertical rack legs (11, 12) and that are attached to the face of the rack (10).

12. In a rack in accordance with claim 1, wherein each of the extensions (14) has a horizontally oriented receiver (16).

13. In a rack in accordance with claim 1, wherein on a hinge side of the door (20) the bearing blocks (21) are attached such that the interior threads (22) face away from an associated horizontal side of the door (20), and on a locking side of the door (20) each of the bearing blocks (21) faces the associated horizontal side of the door (20).

14. In a rack in accordance with claim 1, wherein the locking bolts (27) are sliding rods of a sliding rod locking device.

15. In a rack in accordance with claim 14, wherein a diameter of each of the sliding rods is matched to a diameter of the guides (26) in the bearing blocks (21).

* * * * *